United States Patent
Hourne

(10) Patent No.: US 9,689,907 B2
(45) Date of Patent: Jun. 27, 2017

(54) DEVICE FOR MEASURING THE VARIATION OF A CAPACITANCE AND ASSOCIATED MEASURING METHOD

(71) Applicants: CONTINENTAL AUTOMOTIVE FRANCE, Toulouse (FR); CONTINENTAL AUTOMOTIVE GmbH, Hannover (DE)

(72) Inventor: Xavier Hourne, Cugnaux (FR)

(73) Assignees: CONTINENTAL AUTOMOTIVE FRANCE, Toulouse (FR); CONTINENTAL AUTOMOTIVE GMBH, Hannover (DE)

( * ) Notice: Subject to any disclaimer, the term of this patent is extended or adjusted under 35 U.S.C. 154(b) by 724 days.

(21) Appl. No.: 14/102,825

(22) Filed: Dec. 11, 2013

(65) Prior Publication Data
US 2014/0172336 A1    Jun. 19, 2014

(30) Foreign Application Priority Data

Dec. 19, 2012    (FR) .................................. 12 62364

(51) Int. Cl.
G01R 27/26    (2006.01)
G06F 17/11    (2006.01)
H03K 17/955    (2006.01)

(52) U.S. Cl.
CPC .......... *G01R 27/2605* (2013.01); *G06F 17/11* (2013.01); *H03K 17/955* (2013.01); *H03K 2217/960715* (2013.01)

(58) Field of Classification Search
CPC ..... H03K 17/955; H03K 2217/960715; G01R 27/26
See application file for complete search history.

(56) References Cited

U.S. PATENT DOCUMENTS 7,023,221 B1    4/2006  Lin
7,307,485 B1 *  12/2007  Snyder ............... G01R 27/2605
                                                        324/548

(Continued)

FOREIGN PATENT DOCUMENTS

CN    1657956    8/2005
CN    1856630    11/2006

(Continued)

OTHER PUBLICATIONS

French Search Report dated Jul. 24, 2013, corresponding to the Foreign Priority Application No. 1262364.

*Primary Examiner* — Matthew Luu
*Assistant Examiner* — Patrick King
(74) *Attorney, Agent, or Firm* — Young & Thompson

(57) ABSTRACT

A method and device for measuring a variation of a capacitance, the device includes: a capacitance having a voltage across its terminals; a charging element and a discharging element; a comparison element; control elements activating the charging element or the discharging element as a function of the value of the voltage across the terminals of the capacitance and of which an output voltage has a high value during the charging and a low value during the discharging; a counter measuring a time representative of a predetermined number of charging and discharging cycles of the capacitance; and an additional capacitance electrically connected to the output voltage and to the capacitance, able to be charged and discharged simultaneously with the charging and discharging of the capacitance.

20 Claims, 5 Drawing Sheets

(56) References Cited

U.S. PATENT DOCUMENTS

| | | |
|---|---|---|
| 7,944,217 B2 | 5/2011 | Lin |
| 8,487,639 B1 * | 7/2013 | Walsh ................... G06F 3/044 |
| | | 324/658 |
| 2005/0068045 A1 * | 3/2005 | Inaba ................ G01R 27/2605 |
| | | 324/678 |
| 2005/0184876 A1 | 8/2005 | Tokudome |
| 2008/0036473 A1 | 2/2008 | Jansson |
| 2008/0116904 A1 * | 5/2008 | Reynolds .............. G06F 3/0416 |
| | | 324/678 |
| 2010/0192329 A1 | 8/2010 | Ieda et al. |
| 2011/0148439 A1 * | 6/2011 | Yamada ............. H03K 17/9622 |
| | | 324/679 |
| 2011/0267309 A1 | 11/2011 | Hanauer et al. |
| 2011/0279131 A1 * | 11/2011 | Kim ...................... G06F 3/044 |
| | | 324/679 |
| 2014/0368222 A1 * | 12/2014 | Curtis ................. G01D 5/2405 |
| | | 324/672 |

FOREIGN PATENT DOCUMENTS

| | | |
|---|---|---|
| CN | 101778983 | 7/2010 |
| EP | 1 791 260 | 5/2007 |

\* cited by examiner

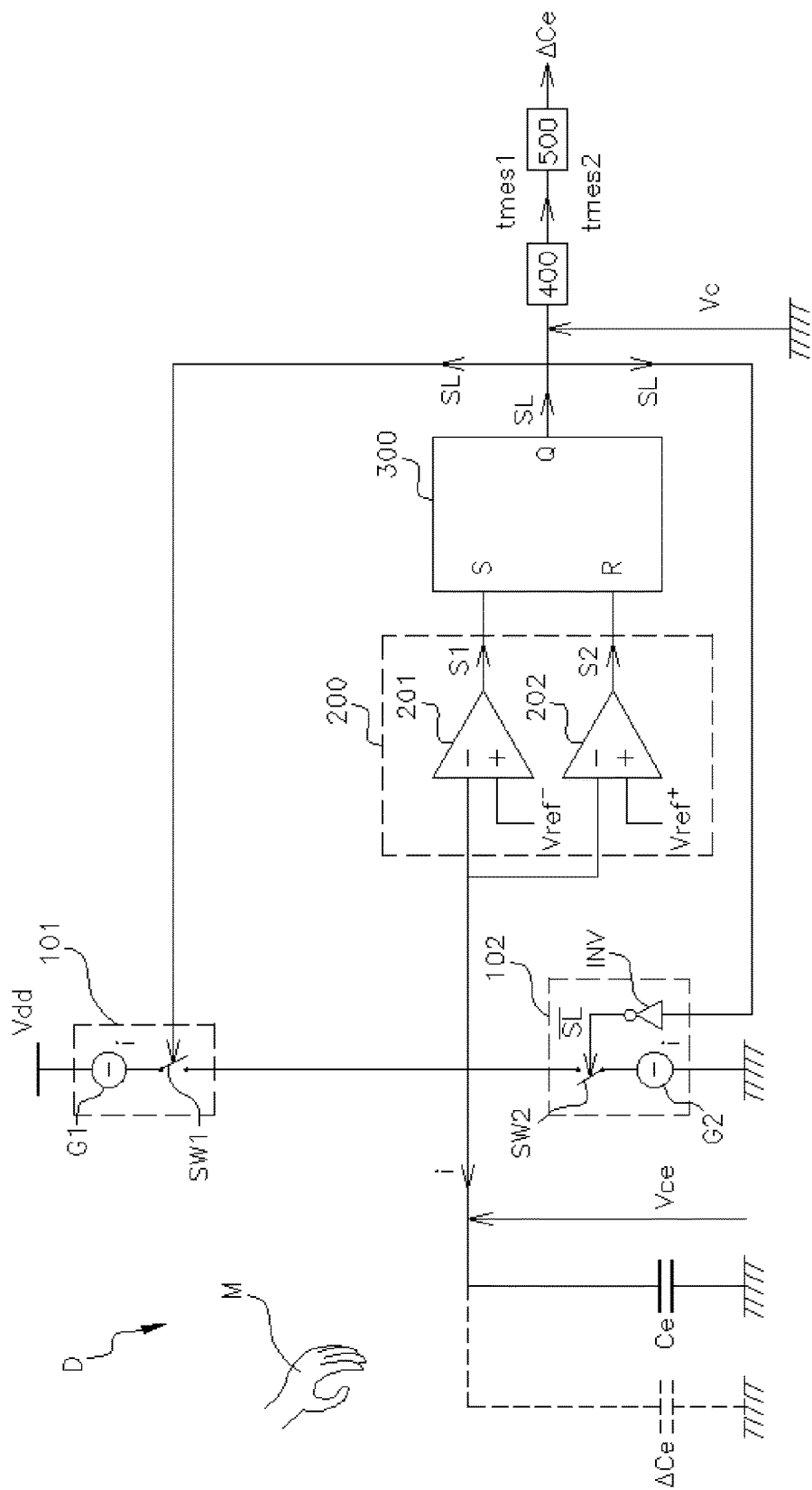

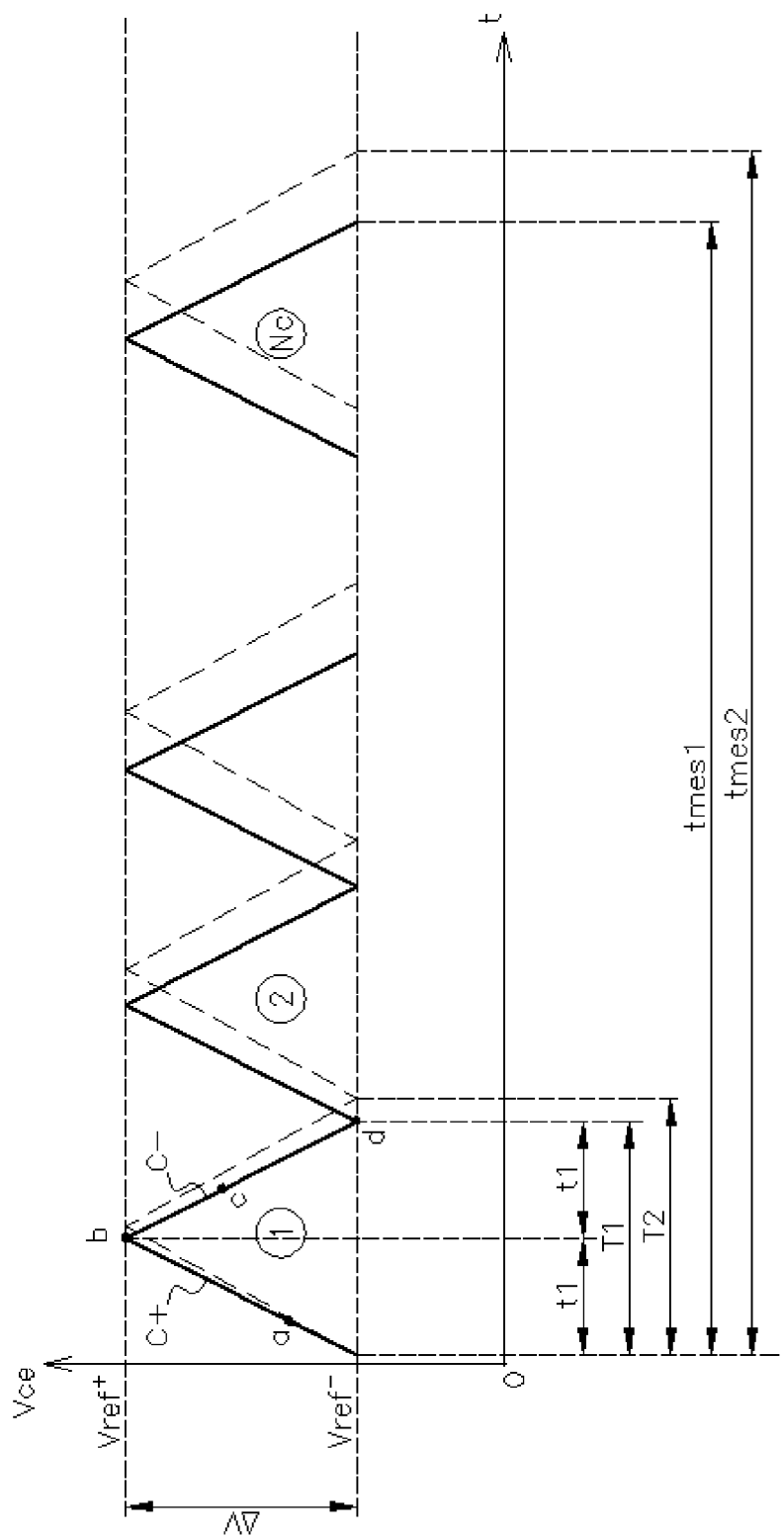

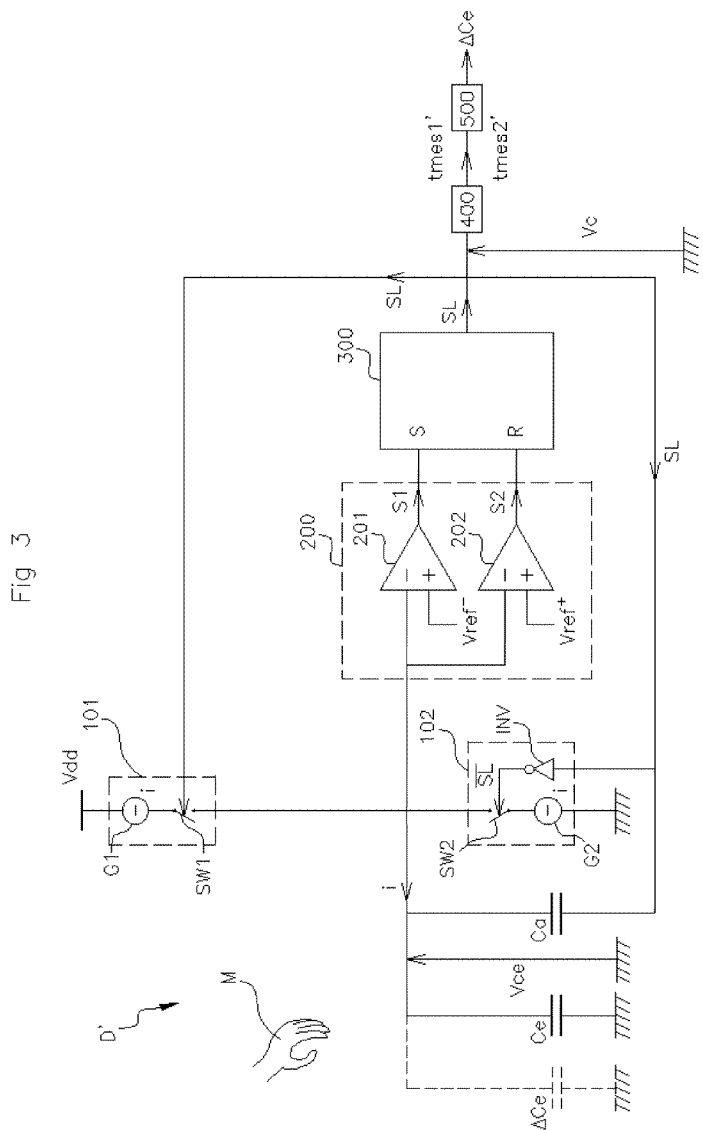

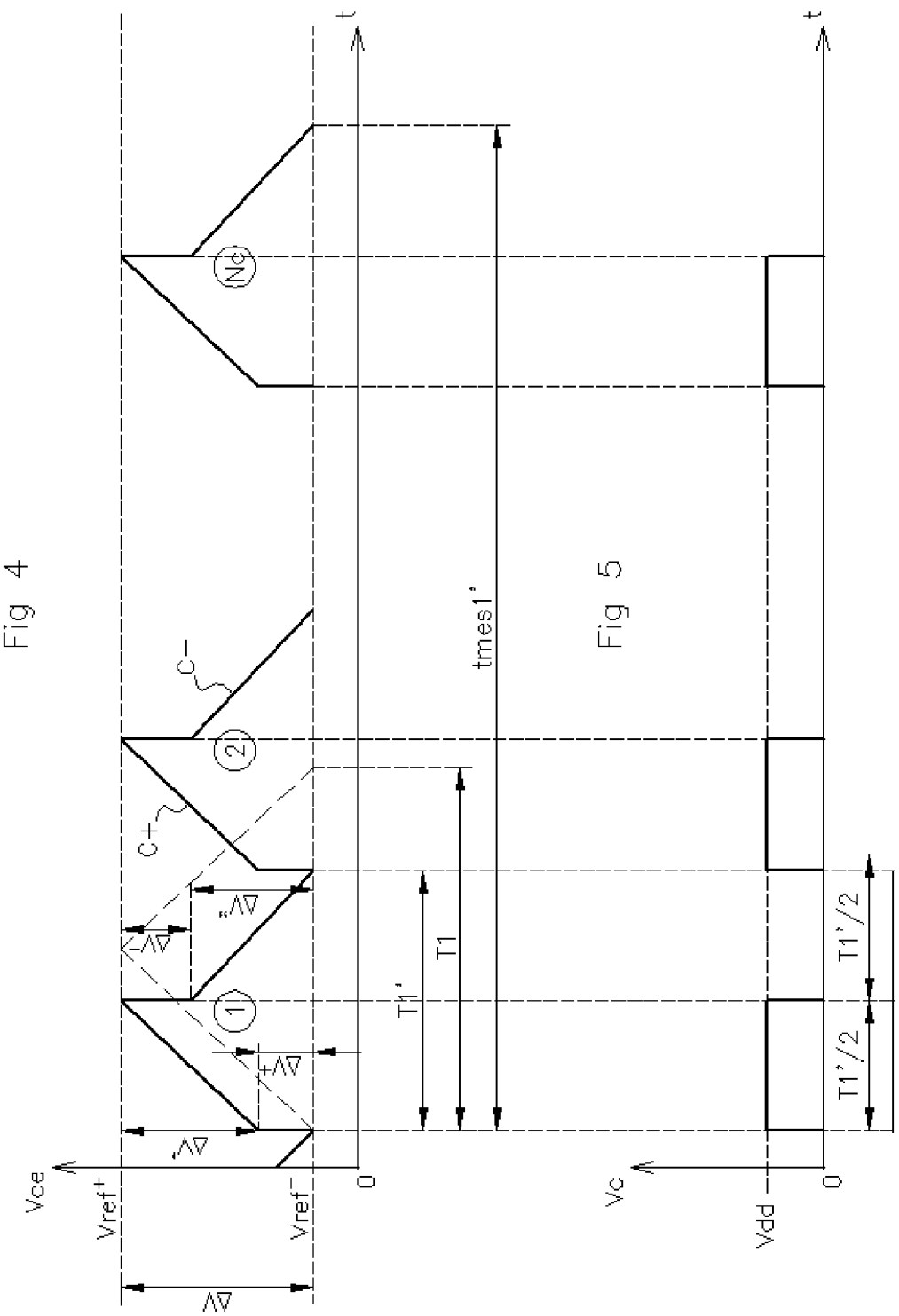

DEVICE FOR MEASURING THE VARIATION OF A CAPACITANCE AND ASSOCIATED MEASURING METHOD

FIELD OF THE INVENTION

The invention relates to a device for measuring the variation of a capacitance and an associated measuring method. The invention applies more particularly to devices installed on motor vehicle for measuring the variation of a capacitance.

BACKGROUND OF THE INVENTION

At present, some motor vehicles are equipped with "hands free" access. This means that the authorized user of the vehicle no longer needs a key in order to open the doors and other openings (bonnet, boot, etc.) of his vehicle. He has instead an identification badge (or remote control) with which the electronic system of the vehicle interacts.

In order to command the opening of a door, for example, the user approaches the door handle. A capacitive presence sensor situated in the handle detects the presence of the user. This sensor is connected to the electronic computer ECU (Electronic Control Unit) of the vehicle and sends it a presence detection signal. The electronic computer of the vehicle has previously identified the user as being authorized to access that vehicle or, alternatively, it carries out this identification after receiving this signal. In order to do this it sends, by the intermediary of an LF (Low Frequency) antenna, an identification request to the badge (or to the remote control) carried by the user. This badge in response sends its identification code to the vehicle electronic computer by means of RF (Radio Frequency) waves. If the electronic computer recognizes the identification code as being the one authorizing access to the vehicle, it initiates the opening of the door. If, on the other hand, the electronic computer has not received the identification code or if the identification code is incorrect, the opening does not take place.

Such a capacitive sensor is constituted by a capacitor electrode Ce (see FIG. 1) integrated in the door handle (not shown).

When the user's hand M approaches the door handle, that is to say when the user approaches the electrode in FIG. 1, the capacitance $C_e$ of the electrode integrated in the handle increases by a value $\Delta C_e$. This variation $\Delta C_e$ of the capacitance Ce is measured by a measuring device D. If the value of the variation $\Delta C_e$ exceeds a threshold, this results in the validation of the detection of the presence of the hand M close to the door handle. In fact, this signifies that the user's hand M is sufficiently close to the handle and that he is requesting access to the vehicle.

According to the prior art, the device D for measuring the variation of the capacitance Ce shown in FIG. 1 comprises:
- a power supply voltage Vdd,
- a capacitance Ce, generally in the form of an electrode, having a voltage Vce across its terminals,
- charging means 101 and of discharging 102 the capacitance Ce, which carries out a predetermined number Nc of charging and discharging cycles of the capacitance Ce,
- comparison means 200, in the form of two comparators,
  - a first comparator 201, comparing the voltage Vce across the terminals of the capacitance Ce with respect to a first reference value Vref⁻, and
  - a second comparator 202, comparing the voltage Vce across the terminals of the capacitance Ce with respect to a second reference value Vref⁺,
- controlling 300 means of the charging means 101 and of the discharging means 102 which activate the charging means 101 and the discharging means 102 of the capacitance Ce according to the result of the comparisons carried out by the comparison means 200 (201, 202) and according to a logic described in detail below,
- a counter 400 which measures the time tmes2 necessary for the measuring device D to carry out the predetermined number Nc of cycles of charging and discharging the capacitance Ce,
- calculating means 500, which calculate a time variation $\Delta t$ between this time tmes2 and a previously measured time tmes1, $\Delta t = \text{tmes2} - \text{tmes1}$, the time variation $\Delta t$ representing the variation $\Delta Ce$ of the capacitance Ce.

The capacitance Ce is successively charged and discharged by the charging means 101 and by discharging means 102 according to a predetermined number Nc of charging and discharging cycles. According to the prior art, the charging means 101 are, for example, a first current source G1 connected to the power supply voltage Vdd, associated with a first switch SW1 connected to the capacitance Ce. When the first switch SW1 is closed (state 1), the capacitance Ce is electrically connected to the first current source G1 which charges it with current i. The discharging means 102 are, for example, a second current source G2 connected to ground, associated with a second switch SW2 connected to the capacitance Ce. When the second switch is closed (state 1), the capacitance Ce is connected to ground through the second current source G2 which discharges it with a current i. When the first switch SW1 is closed (state 1), the second switch SW2 is open (state 0) and vice-versa.

The voltage Vce across the terminals of the capacitance Ce therefore varies according to the state of the first switch SW1 and of the second switch SW2, that is to say depending on whether the capacitance Ce is being charged or discharged.

This voltage Vce is compared with a first reference value Vref⁻ and with a second reference value Vref⁺ by the first and second comparators 201 and 202 respectively. A value of a first output S1 of the first comparator 201 is a function of the result of the comparison with the first reference value Vref⁻. For example, the first output S1 takes the value 0 when Vce>Vref⁻ and it takes the value 1 when Vce<Vref⁻. Similarly, a value of a second output S2 of the second comparator 202 is a function of the result of the comparison with the second reference value Vref⁺. For example, the second output S2 takes the 0 when Vce<Vref⁺ and it takes the value 1 when Vce>Vref⁺.

The first and second outputs S1 and S2 are connected to the inputs of the control means 300. The control means 300 are typically, according to the prior art, a logic circuit of the of the synchronous flip-flop type, also called an "SR flip-flop". The first output S1 is connected to a first input, input S, of the control means 300 and the second output S2 is connected to a second input, input R, of the control means 300. An output Q of the control means 300 provides a control signal $S_L$ of the first switch SW1 and the second switch SW2, of value 0 (state 0: switch open) or 1 (state 1: switch closed) depending on the values S1 and S2 received at the inputs S and R.

The control means 300 activate the charging 101 or discharging 102 means, that is to say more precisely the first SW1 and second SW2 switch according to the values received at the R and S inputs in order to discharge or charge the capacitance Ce.

Charging and discharging cycles of the capacitance Ce are shown in FIG. 2. FIG. 2 shows the variation of the voltage Vce across the terminals of the capacitance Ce during the chargings C+ and during the dischargings C− of the capacitance Ce as a function of time t. As shown in FIG. 2, during a charging C+, the voltage Vce increases, from the first reference value $Vref^-$ to the second reference value $Vref^+$. During a discharging C−, the voltage Vce decreases from the second reference value $Vref^+$ to the first reference value $Vref^-$. The voltage Vce therefore oscillates between the first reference value $Vref^-$ and the second reference value $Vref^+$.

As the value of the charging current i is equal to the discharging current i, the charging time is equal to the discharging time of the capacitance Ce. This (charging or discharging) time will be called t1. The time of a cycle T1 comprising a charging and a discharging is therefore equal to:

$$T1 = 2*t1 = \frac{2*Ce*(Vref^+ - Vref^-)}{i} \quad \text{Equation (1)}$$

where:
T1: time of a charging and discharging cycle(s)
t1: time of a charging or a discharging(s)
Ce: value of the capacitance Ce (F)
$Vref^+$: second reference value (V)
$Vref^-$: first reference value (V)
i: absolute value of the charging or discharging current (A)

The change from a charging C+ to a discharging C− (and vice-versa) is controlled by the control means 300 on the basis of the result of the comparisons between the voltage Vce and each of the two reference values ($Vref^-$, $Vref^+$).

Table 1 below shows the four possible configurations of the first SW1 and second SW2 switches, according to the values received on the R and S inputs and the value of the corresponding output Q. $Q_{t-1}$ signifies that the output Q retains the value of the preceding moment of time. The table refers to four points a, b, c, d shown in FIG. 2:
  point a: Vce>$Vref^-$, the capacitance Ce is charging C+, the first switch SW1 is closed (state 1) and the second switch SW2 is open (state 0),
  point b: Vce>$Vref^+$ opening of the first switch SW1 (state 0) and closing of the second switch SW2 (state 1) in order to discharge the capacitance Ce,
  point c: Vce<$Vref^+$, the capacitance Ce is discharging C−, the same configuration as for the point b, the first switch SW1 is open and the second switch SW2 is closed,
  point d: Vce<$Vref^-$, opening of the second switch SW2 (state 0) and closing of the first switch SW1 (state 1) in order to charge the capacitance Ce.

A voltage inverter INV (FIGS. 1 and 3) situated upstream of the second switch SW2 between the control means 300 and the second switch SW2 makes it possible to invert the value of the control signal SL at the output Q, which gives a signal of opposite value $\overline{SL}$ applied to this second switch SW2. This makes it possible for the first SW1 and second SW2 switches to receive opposite instructions (0, 1), corresponding to the values of table 1 (see SW1, and SW2).

The charging C+ and discharging C− cycle thus described is repeated a predetermined number Nc of times.

The output Q of the control means 300 is therefore alternately connected either to the power supply voltage Vdd (when the first switch SW1 is closed and the second switch SW2 is open), or to ground (when the second switch SW2 is closed and the first switch SW1 is open).

TABLE 1

| Point | a | b | c | d |
|---|---|---|---|---|
| R | S2 = 0 | S1 = 1 | S2 = 0 | S2 = 0 |
| S | S1 = 0 | S1 = 0 | S1 = 0 | S1 = 1 |
| Q (SL) | $Q_{t-1}$ (= 1) | 0 | $Q_{t-1}$ (= 0) | 1 |
| SW1 State | 1 | 0 | 0 | 1 |
| $\overline{Q(SL)}$ | 0 | 1 | 1 | 0 |
| SW2 State | 0 | 1 | 1 | 0 |

The output voltage Vc of the control means 300 is therefore equal to the power supply voltage Vdd during the charging C+ and is equal to 0 Volt during the discharging C− of the capacitance Ce.

A counter 400 measures the time tmes1 necessary for the measuring device D in order to carry out this predetermined number Nc of charging and discharging cycles.

Hence the equation (2):

$$\text{tmes1} = Nc*T1$$

When the user moves his hand M towards the handle, the capacitance Ce increases by a value ΔCe (see FIG. 1). This variation ΔCe of capacitance has the effect of increasing the charging and discharging cycle time, and the new time of a cycle T2 (see FIG. 2, curve shown in dotted line), when the hand M is present, is longer than the cycle time T1 without the presence of the hand M. A new and longer time tmes2 is then necessary for carrying out the same predetermined number Nc of cycles (see FIG. 2) when the hand M is present close to the capacitive sensor.

The difference between the new time tmes2 and the previously measured time tmes1 is representative of the variation ΔCe of the capacitance Ce due to the presence of the hand M. According to the prior art, the variation ΔCe is given by the following equation (3):

$$\Delta Ce = \frac{(tmes2 - tmes1)*i}{2*(Vref^+ - Vref^-)*Nc}$$

Since, according to the equation (2):

$$\text{tmes1} = Nc*T1$$

and also:

$$\text{tmes2} = Nc*T2$$

where:
ΔCe: variation of the capacitance Ce (F)
tmes2: new time (with the hand present) for carrying out a predetermined number Nc of charging and discharging cycles(s)
tmes1: time (without the hand present) for carrying out a predetermined number Nc of charging and discharging cycles(s)
$Vref^+$: second reference value (V)
$Vref^-$: first reference value (V)
i: absolute value of the charging or discharging current (A)
Nc: predetermined number of charging and discharging cycles The following equation (4) is therefore obtained:

$$\Delta Ce = \frac{(T2 - T1) * i}{2 * (Vref^+ - Vref^-)}$$

T1: time of a charging and discharging cycle (without hand present)(s)
T2: new time of a charging and discharging cycle (with hand present)(s)

The closer the hand M approaches, the greater this variation $\Delta Ce$ becomes. When it exceeds a threshold, it is considered that the user wishes to access his vehicle and therefore the detection of presence of the user is validated.

The electrical consumption of the measuring device D and therefore of the capacitive sensor (or of the capacitance Ce electrode) is directly proportional to the time of a charging and discharging cycle T1 (or T2). If it is desired to lower this consumption, it is necessary to reduce the time of a cycle T1.

According to equation (1), in order to reduce the time of a cycle T1, it is necessary:
  either to lower the value of the voltage difference $\Delta V$ between the second reference value and the first reference value, that is to say to lower:

$\Delta V = Vref^+ - Vref^-$ or to increase the value of the charging current i,
  or to lower the value of the capacitance Ce,
  now, according to equation (4):
  lowering the value of the voltage difference $\Delta V = Vref^+ - Vref^-$ increases the value of the variation $\Delta Ce$ which is measurable, and therefore degrades the sensitivity of the sensor,
  increasing the value of the charging current i also increases the value of the variation $\Delta Ce$ which is measurable, and therefore degrades the sensitivity of the sensor,
  the value of the capacitance Ce has no effect on the value of the variation $\Delta Ce$.

Consequently, these traditional approaches of reducing the cycle time T1 have the effect of degrading the sensitivity of the sensor, which is not desirable.

SUMMARY OF THE INVENTION

The purpose of the invention is to reduce the charging and discharging cycle time T1 of the capacitance Ce in order to lower the electrical consumption of the capacitive sensor without degrading its sensitivity. The invention also makes it possible, in a variant of the measuring device, to improve the insensitivity of the capacitive sensor with respect to external electromagnetic interference.

For this purpose, the invention proposes a device D' for measuring the variation $\Delta Ce$ of a capacitance Ce and an associated measuring method.

The invention proposes a device for measuring the variation of a capacitance, comprising:
  a capacitance having a voltage across its terminals,
  a power supply voltage,
  charging and discharging means of the said capacitance,
  comparison means, comparing the voltage across the terminals of the capacitance with a first reference value and with a second reference value,
  control means activating the charging means or discharging means in order to charge or discharge the capacitance as a function of the value of the voltage across terminals of the capacitance and of which an output voltage has a high value during the charging and a low value during the discharging,
  un counter measuring a time representative of a predetermined number of charging and discharging cycles of the capacitance,
  the variation of this time with respect to a previously measured time being representative of the variation of the capacitance.

According to the invention, the measuring device furthermore comprises an additional capacitance:
  a first end of which is electrically connected to the output voltage of the control means and a second end of which is electrically connected to the capacitance,
  able to be charged and discharged by the charging and discharging means simultaneously with the charging and discharging of the capacitance.

According to the invention, the presence of the additional capacitance and the particular way in which it is connected to the components of the measuring device generate a sudden increase of voltage across the terminals of the capacitance at the beginning of its charging and a sudden decrease of the voltage across the terminals of the capacitance at the beginning of its discharging. These sudden increases and decreases of voltage make it possible to reduce the charging and discharging cycle time of the said capacitance and therefore to reduce the consumption of the capacitive sensor.

The voltage comparison means can comprise:
  a first comparator of which a first output value is a function of the comparison between the voltage across the terminals of the capacitance and a first reference value,
  un second comparator, of which a second output value is a function of the comparison between the voltage across the terminals of the capacitance and a second reference value,
the control means activating the charging means or discharging means as a function of the first and of the second output values.

According to the invention, the absolute value of the difference between the first reference value and the second reference value is less than the difference between the high value and the low value.

In one embodiment:
  the charging means are connected to the power supply voltage and
  the discharging means are connected to ground, and
  the high value is equal to the value of the power supply voltage, and
  the low value is equal to 0.
In another embodiment:
  the charging means comprise:
    a first current source powered by the power supply voltage providing a charging current,
    a first switch,
  the discharging means comprise:
    a second switch,
    a voltage inverter situated between the second switch and the control means,
    a second current source electrically connected on one side to the ground and on the other side to the second switch,
the first and second switches being activated by the control means.

Preferably, the control means comprise a logic circuit of the synchronous flip-flop type, a first input of which is electrically connected to the first output of the first comparator, a second input of which is electrically connected to the second output of the second comparator and a logic output of which is electrically connected to the first and second switches.

Advantageously, according to the invention, a charging and discharging cycle time is defined by:

$$T1' = \frac{2*Ce*(Vref^+ - Vref^-)}{i} + \frac{2*Ca*(Vref^+ - Vref^- - Vdd)}{i}$$

where:
T1': charging and discharging cycle time according to the invention(s)
Ce: value of the capacitance Ce (F)
Vref$^-$: first reference value (V)
Vref$^+$: second reference value (V)
Ca: value of the additional capacitance (F)
Vdd: value of the power supply voltage (V)
i: value of the charging or discharging current In a variant of the invention, a resistor is connected between the capacitance and the second end of the additional capacitance able to create a low-pass filter with the additional capacitance having a cut-off frequency Fc:

$$Fc = \frac{1}{2*n*R*Cu}$$

where:
R: value of the resistor (Ω)
Ca: value of the additional capacitance (F)

The invention also relates to a method for measuring the variation of the capacitance using the measuring device according to any one of the preceding claims, the said measuring method comprising the following steps:
  Step 1: when the voltage across the terminals of the capacitance is lower than the first reference value, activation by the control means of the charging means in order to charge the capacitance, resulting in a variation of the output voltage of the control means from the low value to the high value,
  Step 2: when the voltage across the terminals of the capacitance is higher than the second reference value, activation by the control means of the discharging means in order to discharge the capacitance, resulting in a variation of the output voltage of the control means from the high value to the low value,
  Step 3: repetition of steps 1 and 2 according to a predetermined number of charging and discharging cycles,
  Step 4: measuring, by the counter, of the time necessary for carrying out the predetermined number of charging and discharging cycles,
  Step 5: calculation, by the calculation means, of the variation of the capacitance, from the time, measured in step 4 and from a previously measured time as follows:

$$\Delta Ce = \frac{(tmes2' - tmes1')*i}{2*(Vref^+ - Vref^-)*Nc}$$

ΔCe: variation of the capacitance (F)
tmes2': time measured in step 4(s)
tmes1': previously measured time(s)
i: value of the charging or discharging current (A)

Vref$^-$: first reference value (V)
Vref$^+$: second reference value (V)
Nc: predetermined number of charging and discharging cycles According to the invention, the measuring method furthermore comprises the following steps:
  Step 1a: during step 1, sudden increase of voltage ΔV$^+$ across the terminals of the capacitance $$\left(\Delta V^+ = \frac{Cu}{(Ca + Ce)} * \Delta Vc\right)$$

and simultaneous charging of the additional capacitance,
  Step 2a: during step 2, sudden reduction ΔV$^-$ of voltage across the terminals of the capacitance $$\left(\Delta V^- = \frac{Ca}{(Ca + Ce)} * \Delta Vc\right)$$

and simltaneous discharging of the additional capacitance,
where:
Ca: value of the additional capacitance Ca
Ce: value of the capacitance Ce
ΔVc: variation of the output voltage Vc The invention also relates to any vehicle door handle or to any vehicle comprising the measuring device whose features are listed above.

BRIEF DESCRIPTION OF THE DRAWINGS

Other subjects, features and advantages of the invention will become apparent on reading the following non-limiting description and on examination of the appended drawings in which:

FIG. 1, already explained above, is a circuit diagram of the device D for measuring the variation of a capacitance according to the prior art, FIG. 2, already explained above, shows the variation of the voltage Vce across the terminals of the capacitance Ce during the charging C+ and discharging C− cycles as a function of time t, according to the prior art, FIG. 3 is a circuit diagram of the device D' for measuring the variation of a capacitance according to the invention, FIG. 4 shows the variation of the voltage Vce across the terminals of the capacitance Ce during the charging C+ and discharging C− cycles as a function of time t, according to the invention, FIG. 5 shows the value of the output voltage Vc of the control means as a function of time t.

DETAILED DESCRIPTION OF THE INVENTION

Figure 6:
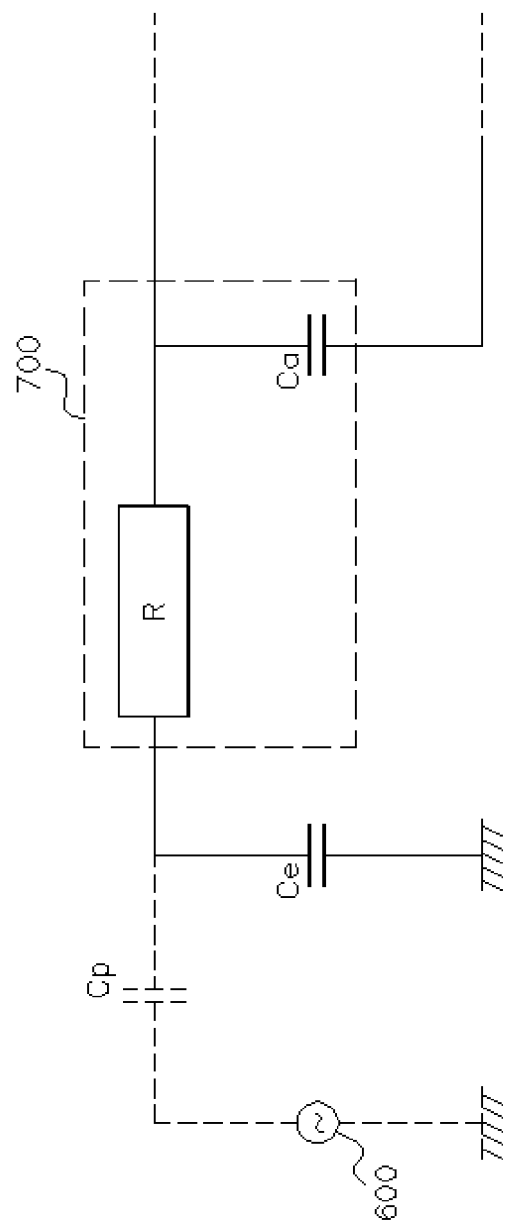
FIG. 6 shows a variant of the measuring device D' according to the invention.

According to FIG. 3, the measuring device D' according to the invention furthermore comprises, in addition to the previously described components of the measuring device D of the prior art, an additional capacitance Ca:
  a first end of which is electrically connected to the output voltage Vc of the control means 300 and a second end of which is electrically connected to the capacitance Ce, able to be charged and discharged by the charging 101 and discharging 102 means simultaneously with the charging and discharging of the capacitance Ce.

Thus, with the measuring device D' of the invention, when the voltage Vce<Vref⁻ (S1=1, S2=0), the control means 300 open the second switch SW2 and close the first switch SW1 in order to simultaneously charge the capacitance Ce and the additional capacitance Ca. This results in a variation of the output voltage Vc of the control means 300. The value of the output voltage Vc of the control means 300 switches over from zero Volts to the value of the power supply voltage Vdd (see FIG. 5). This sudden increase of the output voltage ΔVc=Vdd−0 is applied across the terminals of the capacitance Ce and creates a sudden increase of voltage ΔV⁺ across the terminals of the capacitance Ce according to the following equation (5):

$$\Delta V^+ = \frac{Ca}{(Ca+Ce)} * \Delta Vc = \frac{Ca}{(Ca+Ce)} * (Vdd - 0) = \frac{Ca}{(Ca+Ce)} * Vdd$$

where:
ΔV⁺: sudden increase of voltage across the terminals of the capacitance Ce (V)
Ca: value of the additional capacitance Ca (F)
ΔVc: sudden increase of the output voltage Vc (V)
Ce: value of the capacitance Ce (F)
Vdd: value of the power supply voltage (V)

This sudden increase of voltage ΔV⁺ is shown on FIG. 4. Then, the first switch SW1 being closed, the capacitance Ce and the additional capacitance Ca are charged simultaneously with current i until the voltage across the terminals of the capacitance Vce is greater than the second reference value, that is to say Vce>Vref⁺.

According to the invention, during this charging C+, the voltage Vce across the terminals of the capacitance increases from the value (Vref⁻+ΔV⁺) to the second reference value Vref⁺ and no longer from the first reference value Vref⁻ to the second reference value Vref⁺ as in the prior art. The voltage Vce across the terminals of the capacitance Ce therefore more quickly reaches the second reference value Vref⁺, representing the end of the charging C+, since the difference ΔV'=(Vref⁺−Vref⁻+ΔV⁺) is smaller than ΔV=(Vref⁺−Vref⁻).

When the voltage across the terminals of the capacitance Vce is higher than the second reference value, that is to say Vce>Vref⁺ (S1=0, S2=1), the control means 300 open the first switch SW1 and close the second switch SW2 in order to simultaneously discharge the capacitance Ce and the additional capacitance Ca. This results in a variation of the output voltage Vc of the control means 300. The value of the output voltage Vc of the control means 300 then switches over from the value of the power supply voltage Vdd to zero Volts (see FIG. 5).

This sudden reduction of the output voltage ΔVc=0−Vdd is applied across the terminals of the capacitance Ce and creates a reduction of voltage ΔV⁻ across the terminals of the capacitance Ce according to the following equation (6):

$$\Delta V^- = \frac{Ca}{(Ca+Ce)} * \Delta Vc = \frac{Ca}{(Ca+Ce)} * (0 - Vdd) = -\frac{Ca}{(Ca+Ce)} * Vdd$$

That is to say:

$$\Delta V^- = -\Delta V^+$$

This sudden reduction of voltage ΔV⁻ is shown in FIG. 4. Then, the second switch SW2 being closed, the capacitance Ce and the additional capacitance Ca are simultaneously discharged with current i until the voltage across the terminals of the capacitance Vce is lower than the first reference value, that is to say Vce<Vref⁻.

According to the invention, during this discharging C−, the voltage Vce across the terminals of the capacitance reduces from the value (Vref⁺−ΔV⁻) to the first reference value Vref⁻ and no longer from the second reference value Vref⁺ to the first reference value Vref⁻, as in the prior art. The voltage Vce across the terminals of the capacitance Ce more quickly reaches the first reference value Vref⁻ representing the end of the discharging, since the difference ΔV''=((Vref⁻−Vref⁻)−ΔV⁻) is smaller than ΔV=(Vref⁺−Vref⁻). Since ΔV⁻=−ΔV⁺, then also ΔV''=ΔV' (see FIG. 4).

According to the invention, the sudden increase ΔV⁺ and the sudden decrease ΔV⁻ of voltage across the terminals of the capacitance Ce, due to the presence of the additional capacitance Ca and to the particular way in which it is connected to the other components of the measuring device D' make it possible to reduce the time T1' of a charging and discharging cycle, as shown by the following formulas.

The time T1' of a cycle according to the invention is defined by the following equation (7):

$$T1' = \frac{2*(Ce+Ca)*|\Delta V'|}{i} = \frac{2*(Ce+Ca)*(\Delta V - \Delta V^+)}{i}$$

Now, according to equation (6):

$$\Delta V^+ = \frac{Ca}{(Ca+Ce)} * Vdd$$

By replacing in equation (7), by its expression given by equation (6), the following is obtained:

$$T1' = \frac{2*Ce*(Vref^+ - Vref^-)}{i} + \frac{2*Ca*(Vref^+ - Vref^- - Vdd)}{i}$$

which is equivalent to:

$$T1' = T1 + A$$

where $$A = \frac{2*Ca*(\Delta V - Vdd)}{i}$$

It is apparent that if it is desired to reduce the time T1' of a charging and discharging cycle according to the invention with respect to the time T1 of a cycle according to the prior art, it is necessary for the term A to be negative, that is to say that ΔV<Vdd.

Now, as the power supply voltage Vdd of the measuring device D is consequently the power supply voltage of the first and second comparators 201 and 202, the absolute value of the difference between the first reference value Vref⁻ and the second reference value Vref⁺ of the said first and second comparators 201 and 202 is necessarily less than or equal to the power supply voltage Vdd of the latter.

Consequently:

$$|Vref^+ - Vref^-| \leq Vdd$$

and, if it is desired that:

$$T1' < T1$$

it is necessary to choose the first reference value $Vref^-$ and the second reference value $Vref^+$ such that:

$$|Vref^+ - Vref^-| < Vdd$$

The time T1' of a cycle according to the invention is therefore less than the time T1 of a cycle of the prior art. Consequently, the time tmes1', necessary for carrying out the predetermined number Nc of charging and discharging cycles is itself also, according to the invention, less than the time tmes1 of the prior art since, according to equation (2):

$$tmes1 = Nc * T1$$

and therefore:

$$tmes1' = Nc * T1'$$

The following is therefore obtained:

$$tmes1' < tmes1$$

When a hand M approaches, the capacitance Ce increases by a variation ΔCe. The time of a cycle T1' also increases by a value ΔT1' and the new cycle time T2' during the presence of the hand M is, according to the invention, given by the following equation (8):

$$T2' = T1' + \Delta T1' = \frac{2*(Ce + \Delta Ce + Ca)*(\Delta V - \Delta V^+)}{i}$$

That is to say $$T1' + \Delta T1 = \frac{2*Ce*(\Delta V - \Delta V^+)}{i} + \frac{2*\Delta Ce*(\Delta V - \Delta V^+)}{i} + \frac{2*Ca*(\Delta V - \Delta V^+)}{i}$$

Now, according to equation (6):

$$\Delta V^+ = \frac{Ca}{(Ca + Ce)} * Vdd$$

The following is therefore obtained:

$$T1' + \Delta T1' = \frac{2*(Ce + Ca)*(\Delta V - \Delta V^+)}{i} + \frac{2*\Delta Ce*\Delta V}{i}$$

and therefore:

$$\Delta T1' = \frac{2*\Delta Ce*\Delta V}{i} = \Delta T1$$

The cycle time variation is therefore the same between the invention (ΔT1') and the prior art (ΔT1) for a given capacitance variation ΔCe or, conversely, the variation of capacitance ΔCe is the same for identical cycle time variations between the invention and the prior art (ΔT1', ΔT1).

Consequently, the sensitivity ΔCe of the sensor is not degraded by the invention; it remains identical to that of the prior art.

In an example embodiment of the invention, it the following is considered:
Ce=30 pF
i=10 µA
$Vref^+ - Vref^- = 2$ V
Vdd=2.5 V
Nc=100

There is obtained, according to the prior art, a time tmes1 in order to carry out the Nc=100 charging and discharging equal to tmes1=1.2 ms and with the invention there is obtained a time tmes1' in order to carry out these Nc=100 charging and discharging cycles equal to tmes1'=0.73 ms. The invention therefore allows a 39% saving of measuring time in comparison with the measuring device D of the prior art whilst retaining the same sensitivity ΔCe of the sensor.

According to the invention, the method for measuring the variation ΔCe of the capacitance Ce comprises the following steps, identical to the steps of the measuring method of the prior art:

step 1: when the voltage Vce across the terminals of the capacitance Ce is less than the first reference value $Vref^-$, activation by the control means 300 of the charging means 101 in order to charge the capacitance Ce, resulting in a variation of the output voltage ΔVc of the control means 300 from the low value (0 Volt) to the high value (Vdd), step 2: when the voltage Vce across the terminals of the capacitance Ce is greater than the second reference value $Vref^+$, activation by the control means 300 of the discharging means 102 in order to discharge the capacitance Ce, resulting in a variation of the output voltage ΔVc of the control means 300 from the high value (Vdd) to the low value (0 Volt), step 3: repetition of steps 1 and 2 according to a predetermined number Nc of charging and discharging cycles, step 4: measuring by the counter 400 of the time tmes2' necessary for carrying out the predetermined number Nc of charging and discharging cycles, step 5: calculation by the calculating means 500 of the variation ΔCe of the capacitance Ce, from the time tmes2' measured in step 4 and from a previously measured time tmes1' according to equation (3):

$$\Delta Ce = \frac{(tmes2' - tmes1')*i}{2*(Vref^+ - Vref^-)*Nc}$$

where:
tmes2': time measured in step 4(s)
tmes1': previously measured time(s)
i: value of the charging or discharging current (A)
$Vref^-$: first reference value (V)
$Vref^+$: second reference value (V)
Nc: predetermined number of charging and discharging cycles Judiciously, according to the invention, the measuring method furthermore comprises the following steps:

step 1a: during step 1, sudden increase of voltage ΔV⁺ across the terminals of the capacitance $$Ce\left(\Delta V^+ = \frac{Ca}{(Ca + Ce)} * \Delta Vc\right)$$

and simultaneous charging of the additional capacitance (Ca), step 2a: during step 2, sudden decrease ΔV⁻ of voltage across the terminals of the capacitance $$\left(\Delta V^- = \frac{Ca}{(Ca+Ce)} * \Delta Vc\right)$$

and simultaneous discharging of the additional capacitance (Ca), where:
Ca: value of the additional capacitance Ca
Ce: value of the capacitance Ce
ΔVc: variation of the output voltage Vc In a second embodiment of the measuring device D' according to the invention, a resistor R (see FIG. 6) is connected between the capacitance of the electrode Ce and the second end of the additional capacitance Ca in order to create a low-pass filter 700, called an "RC" filter, with the additional capacitance Ca.

The low pass filter thus created has a cut-off frequency Fc given by:

$$Fc = \frac{1}{2*\pi*R*Ca}$$

where:
R: value of the resistor (Ω)
Ca: value of the additional capacitance (F)

By choosing the value of this resistor R appropriately, the electromagnetic interference, (represented in FIG. 6 in the form of an alternating voltage generator 600 associated with a coupling capacitor Cp), whose frequency is above the cut-off frequency Fc will be greatly attenuated by this low pass filter.

This low pass RC filter not only makes it possible to improve the resistance of the measuring device D' to external electromagnetic interference to which it could be subjected once fitted on the vehicle (the car passing under a high voltage line, for example) but also to facilitate the passing of EMC (Electro-Magnetic Compatibility) tests during the development phase of the capacitive sensor.

The invention therefore makes it possible, by the addition of an additional capacitance and by the particular way in which it is connected to the components of the measuring device, to reduce the measuring time of the capacitive sensor without degrading its sensitivity. The consumption of the capacitive sensor is therefore reduced. Finally, the invention also makes it possible, buy the intermediary of this additional capacitance and an additional resistor, to improve the robustness of the capacitive sensor with respect to external electromagnetic interference.

The invention claimed is:

1. A device (D') for measuring a variation (ΔCe) of a capacitance of a capacitor (Ce), comprising:
    a capacitor (Ce) having a first voltage (Vce) across its terminals,
    a power supply voltage (Vdd),
    charging means and discharging means (102) with current (i) of the said capacitor (Ce),
    means of comparison (200), comparing the first voltage (Vce) across the terminals of the capacitor (Ce) with a first reference value (Vref⁻) and with a second reference value (Vref⁺),
    control means (300):
        activating the charging means (101) or the discharging means (102) in order to carry out a charging (C+) or a discharging (C−) of the capacitor (Ce) as a function of the value of the first voltage (Vce) across the terminals of the capacitor (Ce), and
        of which an output voltage (Vc) has a high value (Vdd) during the charging (C+) and a low value (0) during the discharging (C−),
    a counter (300) measuring a time (tmes2') representative of a predetermined number (Nc) of charging and discharging cycles of the capacitor (Ce),
        the variation of this time (tmes2') with respect to a previously measured time (tmes1') being representative of the variation (ΔCe) of the capacitor (Ce),
    an additional capacitor (Ca), wherein,
        a first end of the additional capacitor (Ca) is electrically connected to the output voltage (Vc) of the control means (300) and a second end of the additional capacitor (Ca) is electrically connected to the capacitor (Ce), and
        the additional capacitor (Ca) is charged and discharged by the charging means (101) and by the discharging means (102) simultaneously with the charging and the discharging of the capacitor (Ce).

2. The measuring device (D') according to claim 1, wherein the voltage comparison means (200) comprise:
    a first comparator (201) of which a first output value (S1) is a function of the comparison between the first voltage (Vce) across the terminals of the capacitor (Ce) and the first reference value (Vref⁻),
    a second comparator (202), of which a second output value (S2) is a function of the comparison between the first voltage (Vce) across the terminals of the capacitor (Ce) and the second reference value (Vref⁺),
    the control means (300) activating the charging (101) or discharging (102) means according to the value of the first and of the second outputs (S1, S2).

3. The measuring device (D'), according to claim 1, wherein the absolute value of the difference between the first reference value (Vref⁻) and the second reference value (Vref⁺) is less than the difference between the high value (Vdd) and the low value (0).

4. The measuring device (D'), according to claim 2, wherein:
    the charging means (101) are connected to the power supply voltage (Vdd) and,
    the discharging means (102) are connected to the ground, and
    the high value is equal to the value of the power supply voltage (Vdd),
    the low value is equal to 0.

5. The measuring uring device (D'), according to claim 2, wherein:
    The charging means (101) comprise
        a first current source (G1) powered by the power supply voltage (Vdd), providing a charging current (i),
        a first switch (SW1),
    the discharging means (102) comprise:
        a second switch (SW2),
        a voltage inverter (INV) situated between the second switch (SW2) and the control means (300),
        a second current source (G2) electrically connected on one side to the ground and on the other side to the second switch (SW2),
    the first and second switches (SW1, SW2), being activated by the control means (300).

6. The measuring device (D'), according to claim 2, wherein the control means (300) comprise a logic circuit of the synchronous flip-flop type, of which a first input (S) is electrically connected to the first output (S1) of the first comparator (201), a second input (R) is electrically connected to the second output (S2) of the second comparator (202) and of which a logic output (Q) is electrically connected to the first and second switches (SW1, SW2).

7. The measuring device (D'), according to claim 2, wherein charging and discharging cycle time (T1') is defined by:

$$T1' = \frac{2*Ce*(Vref^+ - Vref^-)}{i} + \frac{2*Ca*(Vref^+ - Vref^- - Vdd)}{i}$$

where:
Ce: value of the capacitance of the capacitor Ce
$Vref^-$: first reference value
$Vref^+$: second reference value
Ca: value of the capacitance of the additional capacitor
Vdd: value of the power supply voltage
i: value of the charging or discharging current.

8. The measuring device (D'), according to claim 2, wherein a resistor (R) is connected between the capacitor (Ce) and the second end of the additional capacitor (Ca) configurable for creating a low-pass filter (700) with the additional capacitor (Ca) having a cut-off frequency (Fc):

$$Fc = \frac{1}{2*\pi*R*Ca}$$

where:
R: value of the resistor
Ca: value of the capacitance of the additional capacitor.

9. A method for measuring the variation (ΔCe) of the capacitor (Ce) using the measuring device (D') according to claim 1, the said measuring method comprising the following steps:
Step 1: when the first voltage (Vce) across the terminals of the capacitor (Ce) is less than the first reference value ($Vref^-$), activation by the control means (300) of the charging means (101) for charging the capacitor (Ce), resulting in a variation of the output voltage (ΔVc) of the control means (300) from the low value (0) to the high value (Vdd),
Step 2: when the first voltage (Vce) across the terminals of the capacitor (Ce) is greater than the second reference value ($Vref^+$), activation by the control means (300) of the discharging means (102) for discharging the capacitor (Ce), resulting in a variation of the output voltage (ΔVc) of the control means (300) from the high value (Vdd) to the low value (0),
Step 3: repetition of steps 1 and 2 according to a predetermined number (Nc) of charging and discharging cycles,
Step 4: measuring by the counter (400) of the time (tmes2') necessary for carrying out the predetermined number (Nc) of charging and discharging cycles,
Step 5: calculation by the calculating means (500) of the variation (ΔCe) of the capacitor (Ce), from the time (tmes2') measured in step 4 and from a previously measured time (tmes1') according to:

$$\Delta Ce = \frac{(tmes2' - tmes1')*i}{2*(Vref^+ - Vref^-)*Nc}$$

where:
tmes2': time measured in step 4
tmes1': previously measured time
i: value of the charging or discharging current
$Vref^-$: first reference value
$Vref^+$: second reference value
Nc: predetermined number of charging and discharging cycles the said measuring method furthermore comprising the following steps:
Step 1a: during step 1, sudden increase of first voltage (Vce) ($\Delta V^+$)across the terminals of the capacitor (Ce) and simultaneous charging of the additional capacitor (Ca),
Step 2a: during step 2, sudden decrease of first voltage (Vce) ($\Delta V^-$) across the terminals of the capacitor (Ce) and simultaneous discharging of the additional capacitor (Ca),
where:
Ca: value of the capacitance of the additional capacitor Ca
Ce: value of the capacitance of the capacitor Ce
ΔVc: variation of the output voltage Vc.

10. The measuring device (D') according to claim 1, in combination with a vehicle door handle.

11. The measuring device (D') according to claim 1, in combination with a vehicle.

12. The measuring device (D'), according to claim 2, wherein the absolute value of the difference between the first reference value ($Vref^-$) and the second reference value ($Vref^+$) is less than the difference between the high value (Vdd) and the low value (0).

13. The measuring device (D'), according to claim 3, wherein:
the charging means (101) are connected to the power supply voltage (Vdd) and,
the discharging means (102) are connected to the ground, and
the high value is equal to the value of the power supply voltage (Vdd),
the low value is equal to 0.

14. The measuring device (D'), according to claim 3, wherein:
The charging means (101) comprise
a first current source (G1) powered by the power supply voltage (Vdd), providing a charging current (i),
a first switch (SW1),
the discharging means (102) comprise:
a second switch (SW2),
a voltage inverter (INV) situated between the second switch (SW2) and the control means (300),
a second current source (G2) electrically connected on one side to the ground and on the other side to the second switch (SW2),
the first and second switches (SW1, SW2), being activated by the control means (300).

15. The measuring device (D'), according to claim 3, wherein the control means (300) comprise a logic circuit of the synchronous flip-flop type, of which a first input (S) is electrically connected to the first output (S1) of the first comparator (201), a second input (R) is electrically connected to the second output (S2) of the second comparator (202) and of which a logic output (Q) is electrically connected to the first and second switches (SW1, SW2).

16. Measuring device (D'), according to claim 3, wherein a charging and discharging cycle time (T1') is defined by:

$$T1' = \frac{2*Ce*(Vref^+ - Vref^-)}{i} + \frac{2*Ca*(Vref^+ - Vref^- - Vdd)}{i}$$

where:
Ce: value of the capacitance of the capacitor Ce
Vref⁻: first reference value
Vref⁺: second reference value
Ca: value of the capacitance of the additional capacitor
Vdd: value of the power supply voltage
i: value of the charging or discharging current.

17. Measuring device (D'), according to claim 3, wherein a resistor (R) is connected between the capacitor (Ce) and the second end of the additional capacitor (Ca) configurable for creating a low-pass filter (700) with the additional capacitor (Ca) having a cut-off frequency (Fc):

$$Fc = \frac{1}{2*\pi*R*Ca}$$

where:
R: value of the resistor
Ca: value of the capacitance if the additional capacitor.

18. The measuring device (D'), according to claim 4, wherein:
The charging means (101) comprise
 a first current source (G1) powered by the power supply voltage (Vdd), providing a charging current (i),
 a first switch (SW1),
the discharging means (102) comprise:
 a second switch (SW2),
 a voltage inverter (INV) situated between the second switch (SW2) and the control means (300),
 a second current source (G2) electrically connected on one side to the ground and on the other side to the second switch (SW2),
the first and second switches (SW1, SW2), being activated by the control means (300).

19. The measuring device (D'), according to claim 4, wherein the control means (300) comprise a logic circuit of the synchronous flip-flop type, of which a first input (S) is electrically connected to the first output (S1) of the first comparator (201), a second input (R) is electrically connected to the second output (S2) of the second comparator (202) and of which a logic output (Q) is electrically connected to the first and second switches (SW1, SW2).

20. The measuring device (D'), according to claim 4, wherein a charging and discharging cycle time (T1') is defined by:

$$T1' = \frac{2*Ce*(Vref^+ - Vref^-)}{i} + \frac{2*Ca*(Vref^+ - Vref^- - Vdd)}{i}$$

where:
Ce: value of the capacitance of the capacitor Ce
Vref⁻: first reference value
Vref⁺: second reference value
Ca: value of the capacitance of the additional capacitor
Vdd: value of the power supply voltage
i: value of the charging or discharging current.

* * * * *